United States Patent [19]

Hanami

[11] Patent Number: 4,878,738
[45] Date of Patent: Nov. 7, 1989

[54] ELECTRO-OPTICAL DEVICE

[75] Inventor: Takayoshi Hanami, Tokyo, Japan

[73] Assignee: Seiko Instruments, Inc., Tokyo, Japan

[21] Appl. No.: 186,283

[22] Filed: Apr. 26, 1988

[30] Foreign Application Priority Data

Apr. 27, 1987 [JP] Japan ................................. 62-103709

[51] Int. Cl.⁴ ............................................... G02F 1/13
[52] U.S. Cl. ..................................... 350/334; 350/355
[58] Field of Search .............................. 350/334, 355; 340/815.2, 815.14, 718, 719; 368/84, 242, 286, 287

[56] References Cited

U.S. PATENT DOCUMENTS 4,020,627  5/1977  Yoshida et al. ......................... 368/84
4,083,177  4/1978  Nishimura et al. ..................... 368/84
4,142,780  3/1979  Sasaki et al. .......................... 350/334
4,183,629  1/1980  Nishimura et al. ................. 350/334
4,690,510  9/1987  Takamatsu et al. ................. 350/334

Primary Examiner—Stanley D. Miller
Assistant Examiner—Anita E. Pellman
Attorney, Agent, or Firm—Bruce L. Adams; Van C. Wilks

[57] ABSTRACT

An electro-optical device comprising: an electro-optical panel having two substrates, at least one of which has a first group of lead terminals, a circuit board having a second group of lead terminals corresponding to the first group of the lead terminals, a connector for electrically connecting together the first and second groups of the lead terminals, a frame for positioning both the electro-optical panel and connector to the circuit board, and a buffer provided on at least a portion between the electro-optical panel and the frame.

17 Claims, 1 Drawing Sheet

ELECTRO-OPTICAL DEVICE

BACKGROUND OF THE INVENTION

The present invention relates to electro-optical devices such as display devices, printer shutters or the like which may employ various kinds of electro-optical elements such as liquid-crystal, plasma, EL or electrochromic elements.

There has heretofore been known one type of electro-optical device which has an electro-optical panel having electrodes extending parallel to each other at substantially equal distances and lead terminals for the electrodes, and a circuit board having terminals corresponding to the lead terminals, and in which the electro-optical panel and the circuit board are electrically connected together through a rubber connector which is formed by alternately laminating an electrically conductive rubber material and an insulating rubber material with a sufficiently small pitch so that one or more conductive portions of the connector are in contact with the electrode surface of one lead terminal at all times. Such an electro-optical device is disclosed, for example, in Japanese Utility Model Publication No. 58-46450 (46450/1983).

The above-described conventional electro-optical device suffers, however, from the following disadvantages. As shown in FIG. 2, the conventional device is provided with a frame 5 made of a metal or resin material for compressibly securing the electro-optical panel 1 and the connector 3 to the circuit board 2 in order to enable the electrode surfaces of the lead terminals of the electro-optical panel 1 and those of the circuit board 2 to be brought into sufficiently close contact with the conductive portions of the rubber connectors 3 so that the contact resistance is minimized. Since the frame 5 is disposed in close proximity with the electro-optical panel 1 which uses glass or the like as a substrate thereof, if external force is applied to the device, for example, when it is accidentally dropped, the glass substrate may collide with the frame 5 on impact, resulting in destruction of the substrate.

To assemble this electro-optical device, two long flexible connectors 3 are placed at predetermined positions, respectively, on the circuit board 2 in such a manner that the connectors 3 stand as straight as possible, and the electro-optical panel 1 is placed on the connectors 3 by visually adjusting the positions of the connectors 3 so that the electrode terminals of the panel 1 coincide with the upper ends of the connectors 3, which involves considerably inferior operating efficiency and also variations in the positional accuracy.

SUMMARY OF THE INVENTION

In view of the above-described disadvantages of the prior art, it is a primary object of the present invention to provide an electro-optical device which is so designed that the electro-optical panel is prevented from being destroyed even when the device is impacted to a certain extent due to a fall or the like.

To this end, according to the present invention, a buffer is provided at a part of a resilient connector made of a rubber or the like which is employed for electrical connection, thereby preventing destruction of the electro-optical panel even if a physical force is applied to the device due to a fall or the like.

By virtue of the above-described arrangement, if the device is impacted due to a fall or the like, the impact is transmitted to the electro-optical panel after being relieved by the buffer provided at a part of the resilient connector, so that it is possible to prevent destruction of the panel.

DETAILED DESCRIPTION OF THE INVENTION

One embodiment of the present invention will be described hereinunder with reference to the accompanying drawings.

Figure 1:
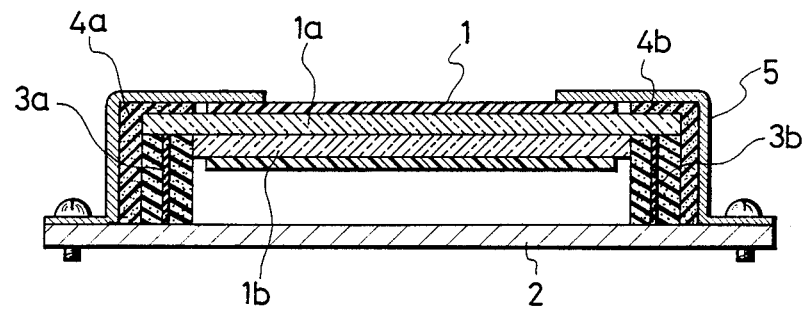
FIG. 1 is a sectional view of one embodiment of the electro-optical device according to the present invention.
Figure 2:
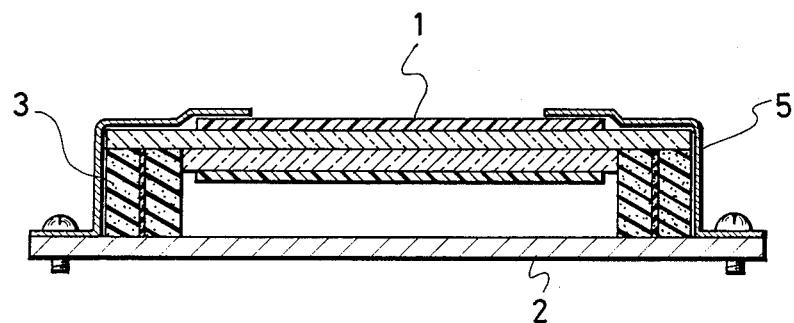
FIG. 2 is a sectional view of a conventional electro-optical device.

Referring to FIG. 1, an electro-optical panel is arranged such that an electro-optical element such as a liquid crystal, plasma, EL or electrochlomic element is sandwiched between two substrates 1a and 1b having electrodes, thereby enabling a voltage to be applied to the element. More specifically, a multiplicity of electrodes are formed on the inner surface of either one of the substrates 1a and 1b in such a manner that the electrodes extend parallel to each other at substantially equal intervals, and also, a multiplicity of electrodes are formed on the inner surface of the other substrate, thus enabling a voltage to be selectively applied to an electro-optical element sandwiches between the two substrates. The multiplicity of electrodes which are formed on the inner surface of one substrate 1a extend as far as the left and right (as viewed in FIG. 1) ends of the substrate 1a which are located outside the cell. These electrodes are electrically connected to compressible, resilient connectors 3a and 3b which are disposed at the left and right ends, respectively, of the substrate 1a, and further electrically connected through these connectors 3a and 3b to a multiplicity of lead patterns, respectively, which are formed on a circuit board 2. Each of the connectors 3a and 3b is a columnar member which is formed by alternately laminating a multiplicity of plates made of a compressible, resilient, electroconductive material (e.g., an electrically conductive rubber) and a multiplicity of plates made of a compressible, resilient, electrically nonconductive material (e.g., an insulating rubber), as disclosed, for example, in U.S. Pat. No. 4,142,781, the columnar members being placed sideways. The connectors 3a and 3b are sufficiently long to cover all the electrodes which terminate at the ends of the substrate 1a. The multiplicity of electrodes which are formed on the inner surface of the substrate 1b are respectively connected to the multiplicity of lead patterns on the circuit board 2 through connectors (those which have an inverted L-shaped or U-shaped cross-section), FPCs (flexible printed circuits) or the like which are disposed at two ends, respectively, of the substrate 1b. The reference numerals 4a and 4b denote buffers which have an inverted L-shaped cross-section and which are made of a compressible, resilient material such as a rubber, plastics or the like. The buffers 4a and 4b have substantially the same length as that of the connectors 3a and 3b and they are connected to the respective connectors 3a and 3b in one unit by means of an adhesive or the like. The reference numeral 5 denotes a frame which is made of a metal, plastics or the like and which is rigidly secured to the circuit board 2. The frame 5 enables the electrodes on the substrate 1a and those on the connectors 3a, 3b to be brought into satisfactorily close contact with each other and also permits the electrodes on the connectors 3a, 3b to be brought into satisfactorily close contact with those on the circuit board 2, thus minimizing the contact resistance. The frame 5 further serves to rigidly secure the electro-optical panel 1, the connectors 3a, 3b, the buffers 4a, 4b and the like to the circuit board 2.

To assemble this electro-optical device, an FPC or the like for circuit connection is attached to the panel substrate 1b, and the two ends of the substrate 1a of the electro-optical panel 1 are forced into the gaps which are defined between the resilient connectors 3a, 3b and the resilient buffers 4a, 4b, respectively. Thereafter, these members thus assembled together in one unit are rigidly secured to the circuit board 2 through the frame 5.

Although the impact resistance of the device can be improved even if the buffers 4a, 4b are provided separately from the connectors 3a, 3b, it is possible to greatly improve the operating efficiency and the positional accuracy in addition to the impact resistance by virtue of the arrangement of the above-described embodiment wherein the buffers 4a, 4b and the connectors 3a, 3b are arranged integral with each other with gaps provided therebetween for receiving the end portions of the substrate 1a of the electro-optical panel 1.

What is claimed is:

1. An electro-optical device comprising: an electro-optical panel having opposed inner and outer substrates, the outer one of which has a first group of lead terminals on the inner surface of the periphery thereof, a circuit board having a second group of lead terminals opposed and corresponding to the first group of the lead terminals, a resilient connector for electrically connecting together the first and second groups of the lead terminals, a frame for positioning both the electro-optical panel and connector to the circuit board, and a resilient buffer affixed to the resilient connector and between at least a portion of the electro-optical panel and the frame, the resilient connector and the buffer defining a gap which receives the periphery of the outer substrate therein so as to protect said outer substrate from externally applied shock.

2. An electro-optical device as claimed in claim 1; wherein the buffer has an L-shaped cross-section.

3. An electro-optical device as claimed in claim 1, wherein said resilient buffer is made essentially of a compressible, resilient material.

4. An electro-optical device as claimed in claim 1, wherein the resilient buffer and the connector are assembled together to form a unitary support structure.

5. An electro-optical device as claimed in claim 4, wherein said gap is slightly smaller than the thickness of the outer substrate of the electro-optical panel received therein.

6. An electro-optical device as claimed in claim 1; wherein the connector has a columnar construction formed by alternately laminating a plurality of compressible, resilient and electro-conductive plates and a plurality of compressible, resilient and non-conductive plates.

7. An electro-optical device as claimed in claim 1; wherein the other of the substrates has a third group of lead terminals connecting to a fourth group of lead terminals of the circuit board through a connector.

8. An electro-optical device as claimed in claim 7; wherein the connector is a compressible, resilient connector or a flexible printed circuit.

9. An electro-optical device as claimed in claim 1; wherein the frame is made of a metal or plastics.

10. A shock-absorbing support assembly for a substrate of an electro-optical device, the assembly comprising: a unitary composite structure consisting of at least one layer of resilient conducting material and at least one layer of resilient nonconducting material, said composite structure defining a recess to receive the substrate, one wall surface of said recess comprising said resilient conducting material for electrically engaging a corresponding conductive portion of the substrate, the other wall surfaces of said recess being formed of said resilient non-conductive material, the periphery of the substrate being substantially surrounded by said wall surfaces of said recess to protect the same from shock.

11. The support assembly of claim 10 in which said one wall surface of said recess engages a portion of the lower surface of the substrate and said other wall surfaces of said recess engage the peripheral edge and a portion of the upper surface of the substrate.

12. The support assembly of claim 10 in which the dimensions of said recess are such that the substrate fits snugly therein.

13. The support assembly of claim 10 in which said layer of resilient conducting material extends throughout the assembly to a distal end thereof in a predetermined direction from said one wall surface.

14. The support assembly of claim 13 in which said one wall surface extends substantially orthogonal to said predetermined direction.

15. The support assembly of claim 14 in which the plane defined by the conductive portion of the substrate is substantially parallel to and contains said one wall surface.

16. The support assembly of claim 15 comprising in addition a printed circuit board electrically engaging said distal end of said resilient conducting material.

17. The support assembly of claim 10 comprising a frame member overlying said layer of resilient non-conducting material.

* * * * *